United States Patent
Lee

(10) Patent No.: US 7,791,965 B2
(45) Date of Patent: Sep. 7, 2010

(54) RINGING MASKING DEVICE HAVING BUFFER CONTROL UNIT

(75) Inventor: Kang Youl Lee, Daejeon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 139 days.

(21) Appl. No.: 12/141,194

(22) Filed: Jun. 18, 2008

(65) Prior Publication Data

US 2009/0161454 A1 Jun. 25, 2009

(30) Foreign Application Priority Data

Dec. 21, 2007 (KR) .................. 10-2007-0135574

(51) Int. Cl.
*G11C 7/00* (2006.01)
(52) U.S. Cl. ............... 365/193; 365/189.05; 365/233.1; 365/233.18
(58) Field of Classification Search .................. 365/193, 365/189.05, 233.1, 233.18
See application file for complete search history.

(56) References Cited

U.S. PATENT DOCUMENTS 7,054,221 B2 * 5/2006 Shim .......................... 365/193
2004/0264291 A1 * 12/2004 Shim .......................... 365/233

FOREIGN PATENT DOCUMENTS

KR 1020050002526 A 1/2005

\* cited by examiner

*Primary Examiner*—Thong Q Le
(74) *Attorney, Agent, or Firm*—Ladas & Parry LLP

(57) ABSTRACT

A ringing masking device includes a data strobe buffer unit buffering a data strobe signal and outputting a rising pulse and a falling pulse synchronized with a buffer signal. A buffer control unit latches a burst end signal to generate a buffer control signal and outputs the buffer control signal according to a control of a pulse signal generated in synchronization with the buffer signal.

15 Claims, 11 Drawing Sheets

US 7,791,965 B2

RINGING MASKING DEVICE HAVING BUFFER CONTROL UNIT

CROSS-REFERENCE TO RELATED APPLICATIONS

The present application claims priority to Korean patent application number 10-2007-0135574 filed on Dec. 21, 2007, which is incorporated herein by reference in its entirety.

BACKGROUND OF THE INVENTION

The present invention relates to a semiconductor device and, more particularly, to a ringing masking device which can resolve a data error due to a ring-back noise in a semiconductor memory device.

Semiconductor devices have been continuously improved both in terms of enhanced operation speed as well as increased integration density. In order to enhance the operation speed of semiconductor devices, a synchronous memory device operating synchronously with a clock given from the outside of a memory chip has been introduced. A double data rate (DDR) synchronous memory device in which two data are inputted or outputted at a single clock period has been suggested for high speed operation.

Presently, in order to realize precise timing for data input/output during high speed operation, a data strobe signal DQS is inputted together with a data signal from a central processing unit or a memory controller outside of the memory device when the data is inputted into the memory device.

The data strobe signal DQS returns to a high impedance state after completion of a postamble, and a ringing may occur before returning to the high impedance state. When the ringing is present after completion of the postamble errors occur as data is latched in synchronization with the rising and falling edges of the erroneous DQS signal corrupted by the ringing. Efforts to solve the problem associated with ringing as discussed above have been made.

FIG. 1 is shows a conventional ring-back noise masking circuit which prevents errors due to the ringing.

Referring to FIG. 1, the ring-back noise mask circuit comprises a DQS buffer unit 10 buffers a data strobe signal DQS to output a buffer signal IDQS, a driver unit 20 outputs the buffer signal IDQS as a driver signal DQSIR according to a control signal, a pulse output unit 30 receives the driver signal DQSIR and outputs a rising pulse DQSRP and a falling pulse DQSFP, and a driver control unit 40 which receives the driver signal DQSIR and outputs a driver control signal DISDSP that disables the driver signal DQSIR.

According to an embodiment of the present invention, a double input buffer that receives data strobe signal pair DQS and DQSB to perform the buffering may be used as the DQS buffer unit 10. Alternatively, a single input buffer that receives the data strobe signal DQS and a reference voltage VREF may also be used, or both the single input buffer and the double input buffer may be used together.

The driver unit 20 outputs the driver signal DQSIR according to the control of the buffer signal IDQS and the control signal DISDSP outputted from the control unit 40. The driver signal DQSIR is outputted as the rising pulse DQSRP and the falling pulse DQSFP through the output unit 30.

Lastly, the control unit 40 comprises a pulse generation unit 42 that receives the driver signal DQSIR and generates a pulse signal DQSP, and a control signal generation unit 46 that receives the pulse signal DQSP and a burst end signal WT24R, applied from the outside, and generates the control signal DISDSP.

The pulse generation unit 42 comprises a delay unit 44 that delays the driver signal DQSIR by a predetermined time, and combines the driver signal DQSIR and the delayed driver signal to generate the pulse signal DQSP. The control signal generation unit 46 comprises a PMOS transistor P1 and NMOS transistor N1, each receiving the burst end signal WT24R as a common gate input, and an NMOS transistor N2 that receives the pulse signal DQSP as a gate input. Also, the control signal generation unit 46 may further comprises a latch unit 48 that latches the outputs of the transistors N1 and N2 and an inverter INV1 that inverts the output of the latch unit 48. The burst end signal is generated according to a counting clock with an internal clock signal in consideration of a burst length BL after an internal write command signal is inputted.

With the above configuration, the control signal DISDSP is enabled to a low level when both the burst end signal WT24R and the pulse signal DQSP become high level.

The driver unit 20 includes a NAND gate ND that receives the control signal DISDSP, and is turned off when the control signal DISDSP is enabled to the low level. Therefore, it is possible to prevent outputting the ringing of the DQS.

FIGS. 2 through 4 show operation waveform diagrams of FIG. 1.

FIG. 2 shows a waveform when the data strobe signal DQS is normally inputted, FIG. 3 shows a waveform when the data strobe signal DQS is inputted in a fast mode, and FIG. 4 shows a waveform when the data strobe signal DQS is inputted in a slow mode.

Referring to FIG. 2, it can be appreciated that when the burst end signal WT24R, which is applied from the outside, is maintained at a high level the control signal DISDSP is enabled to a low level at a rising edge of the pulse signal DQSP generated by the driver signal DQSIR. Therefore, it is possible to prevent the output of the pulse which is generated by the ringing.

However, according to the conventional device, as shown in FIG. 1, inputting the data strobe signal DQS earlier, i.e., in a tDQSSmin condition, does not solve the error associated with the related art.

Referring to FIG. 3, the rising edge of the burst end signal WT24R, which is applied from the outside, is delayed more than the rising edge of the pulse signal DQSP, which is synchronized with the data strobe signal DQS(fast). Therefore, the control signal DISDSP is not enabled immediately at the rising edge of the pulse signal DQSP, but rather enabled at the delayed rising edge of the burst end signal WT24R. Therefore, delay corresponding to tERR is generated, which results in the output of a pulse due to the ringing. In order to solve the above error, a method that shortens the burst end signal WT24R to advance its rising edge before the rising edge of the pulse signal DQSP may be suggested. However, another problem, as shown in FIG. 4 and described below, is still generated.

The error is still generated when the data strobe signal DQS is inputted later, i.e. in a tDQSSmax condition.

Referring to FIG. 4, it can be appreciated that a rising edge of the burst end signal WT24R occurs during a high period of a pulse DQSP, which is synchronized with a third pulse of the data strobe signal DQS(slow), as the data strobe signal DQS(slow) is inputted later. Therefore, when the rising edge of the burst end signal WT24R occurs, a more serious error occurs. That is, the control signal DISDSP is enabled to the low level and the fourth normal pulse cannot be inputted.

In order to prevent such an error, the rising edge of the burst end signal WT24R should occur after the falling edge of the pulse signal DQSP synchronized with the third pulse of the strobe signal DQS(slow). In other words, a margin tMARGIN, as shown in FIG. 4, should be ensured. Another serious problem may occur when advancing the time point of pulse generation of the burst end signal WT24R to prevent the error in the tDQSSmin. That is, a normal signal cannot be outputted, because the control signal DISDSP is enabled in the high period of the third pulse as the margin tMARGIN (which can ensure effective data) is not ensured.

SUMMARY OF THE INVENTION

There is provided a ringing masking device which is capable of preventing error due to a ringing regardless of the input mode of a strobe signal.

According to a first aspect of the present invention, there is provided a ringing masking device, which comprises a data strobe buffer unit buffering a data strobe signal and outputting a rising pulse and a falling pulse synchronized with a buffer signal; and a buffer control unit generating a buffer control signal by latching a burst end signal and outputting the buffer control signal according to a control of a pulse signal generated in synchronization with the buffer signal.

Preferably, the buffer control unit comprises a pulse generation unit receiving, as input, the buffer signal and generating a pulse signal; a burst end signal generation unit receiving, as input, an internal write command signal and an internal clock signal and generating the burst end signal which notifies an end of a write operation; and a control signal generation unit latching the burst end signal to generate the buffer control signal and outputting the buffer control signal by control of the pulse signal.

Preferably, a rising edge of the burst end signal is generated prior to a rising edge of a pulse synchronized with the last edge of the data strobe signal among the pulse signals.

Preferably, the burst end signal generation unit comprises a counter unit receiving, as input, the internal write command signal and the internal clock signal and counting the number of clock generated after the input of the internal write command signal to output a plurality of counter signals; and a selection unit receiving the plurality of the counter signals and selectively outputting the signals according to a burst length signal.

Preferably, the counter unit comprises a RS latch generating a pulse having a size of a single clock period, which is set at the internal write command signal and reset at the internal clock signal, and a plurality of D latches transferring the output of the RS latch to every rising edges of the clock.

Preferably, the selection unit delays the selected counter signal to cause the rising edge to be generated prior to the last rising edge of the effective pulse of the pulse signal.

Preferably, the control signal generation unit comprises a latch unit inverting the burst end signal; and a transfer unit controlled by the pulse signal and controlling transfer of a signal inputted into the latch unit and a signal outputted from the latch unit.

Preferably, the transfer unit comprises a first transfer unit inverting the burst end signal to transfer to the latch unit when the pulse signal is in logic 'low'; and a second transfer unit inverting the burst end signal to transfer to the latch unit when the pulse signal is in logic 'high'.

Preferably, the latch unit comprises a NOR calculation unit receiving, as input, the burst end signal and the internal write command signal, and an inverter inverting the output of the NOR calculation unit and feeding back the inverted output to the NOR calculation unit.

Preferably, the control signal generation unit further comprises a latch unit receiving, as input, the internal write command signal and disabling the buffer control signal to logic 'high' when the internal write command signal is enabled.

According to a second aspect of the present invention, there is provided a ringing masking device, which comprises a data strobe buffer unit buffering a data strobe signal and outputting a buffer signal; a driver unit driving the buffer signal to output a driver signal; a pulse output unit receiving the driver signal and outputting a rising pulse and a falling pulse; and a ringing control signal generation unit receiving a burst end signal indicating a time point at which a write is finished to latch it, controlling transfer of input and output of the burst end signal by a pulse signal generated by combination of the driver signal, and outputting a ringing control signal enabled to low level to disable the driver at the time point at which both the burst end signal and the pulse signal become high level.

Preferably, the ringing control signal generation unit enables the ringing control signal as soon as the rising edge of the pulse signal is generated when the pulse signal is transited to high level after the burst end signal is transited to high level.

Preferably, the ringing control signal generation unit latches the burst end signal at a rising edge of the pulse signal and then enables the ringing control signal at the next rising edge of the pulse signal when the burst end signal is transited to high level after the pulse signal is transited to high level.

Preferably, the ringing control signal generation unit comprises a latch unit latching the burst end signal; a first transfer unit transferring the burst end signal to the latch unit when the pulse signal is in low level; and a second transfer unit transferring the output signal of the latch unit when the pulse signal is in high level.

Preferably, the ringing control signal generation unit comprises a latch unit disabling the ringing control signal when the internal write command signal is enabled.

According to the present invention, it is possible to prevent an error due to a ringing even when a data strobe signal is inputted earlier by advancing the time point at which a pulse of a burst end signal is generated.

Also, according to the present invention, it is possible to prevent an error due to a ringing even when a data strobe signal is inputted later by latching the burst end signal and controlling the latched signal by a pulse synchronized with the data strobe signal.

DESCRIPTION OF SPECIFIC EMBODIMENTS

The present invention discloses a device which advances a time point of generation of a burst end signal and latches at a rising edge of the burst end signal at the same time to remove a noise due to a ringing of the data strobe signal generated after a postamble in both tDQSSmin/max modes as well as in a normal mode.

Hereinafter, preferred embodiments of the present invention will be described in detail with reference to the accompanying drawings.

Figure 5:
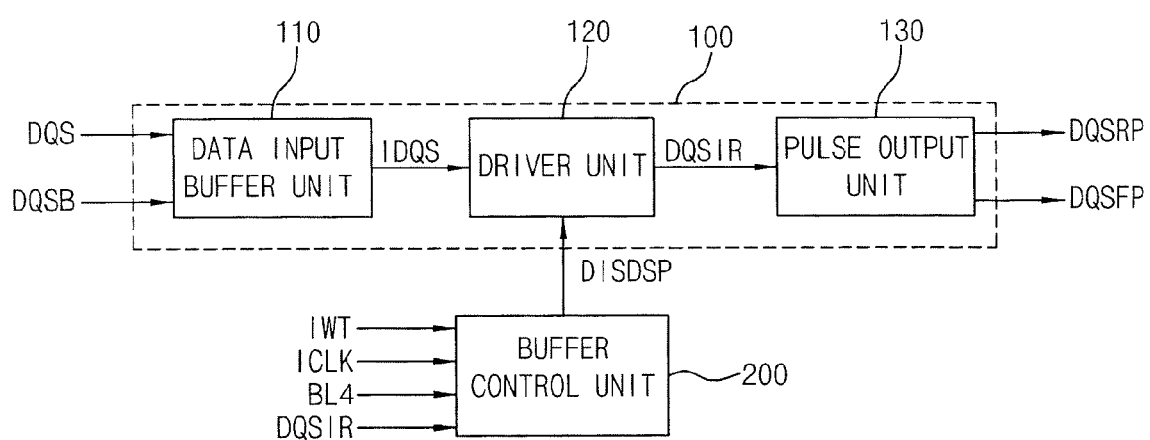
FIG. 5 is a block diagram showing a ringing masking device according to an embodiment of the present invention.

FIG. 5 is a general block diagram showing a ringing masking device according to an embodiment of the present invention.

Referring to FIG. 5, a ringing masking device, according to an embodiment of the present invention, includes a data strobe buffer unit 100 which buffers a data strobe signal and outputs both a rising pulse synchronized with the buffer signal and a falling pulse synchronized with a falling edge, and a buffer control unit 200 which controls the output of the data strobe buffer unit 100.

The data strobe buffer unit 100 includes a data input unit 110 which receives and buffers data strobe signal pair DQS and DQSB and outputs a buffer signal IDQS, a driver unit 120 which receives the buffer signal IDQS and outputs a driver signal DQSIR in response to a buffer control signal DISDSP, and a pulse output unit 130 which delays the driver signal DQSIR by a predetermined time and outputs a rising pulse DQSRP and a falling pulse DQSFP.

The buffer control unit 200 receives an internal write command signal IWT, an internal clock signal ICLK, a burst length signal BL4, and the driver signal DQSIR and disables the data strobe buffer at the time point at which the write finished, thereby preventing output of the ringing signal. That is, it is not possible to prevent the generation of the ringing on the data strobe signal DQS, but it is possible to prevent the output of the ringing signal.

Figure 6:
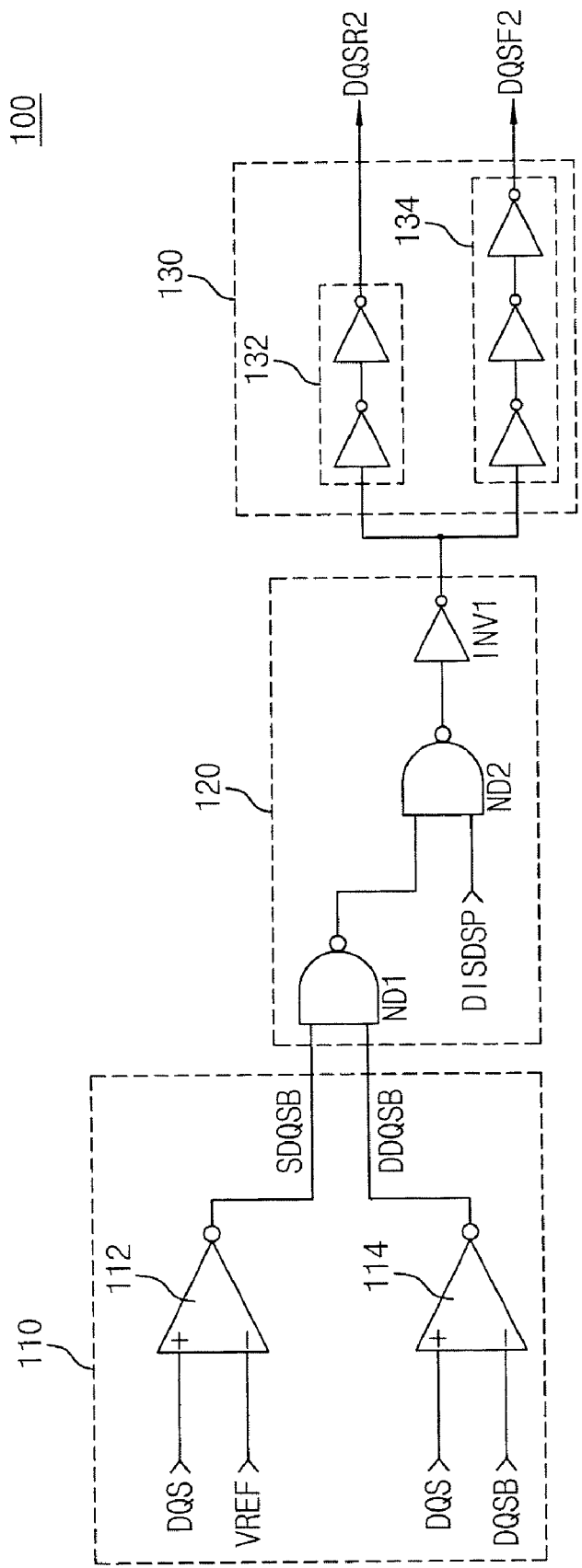
FIG. 6 is a detailed circuit diagram showing an example of a data strobe buffer unit 100 in FIG. 5.

FIG. 6 is a detailed circuit diagram of the data strobe buffer unit 100.

Referring to FIG. 6, the data input unit 110 includes a single input buffer 112 which receives the data strobe signal DQS and a reference voltage VREF and a differential input buffer 114 which receives the data strobe signal DQS and an inverted data strobe signal DQSB. The single input buffer 112 and the differential input buffer 114 are configured such that only one input buffer operates at a given time, and the other buffer, which does not operate, maintains a logic 'high' level to allow the operating signal to be transferred to the driver unit 120. Although having the two input buffers 112 and 114 is preferred in the present embodiment, it may be possible that only one of two buffers is in present in alternative embodiments.

The driver unit 120 includes a NAND gate ND1 which receives, the signals SDQSB and DDQSB outputted by the two input buffers 112 and 114, a NAND gate ND2 which receives the output signal of the NAND gate ND1 and the buffer control signal DISDSP, and an inverter INV1 which inverts the output of the NAND gate ND2.

The pulse output unit 130 includes a rising pulse output unit 132 that outputs the rising pulse DQSRP and a falling pulse output unit 134 that outputs the falling pulse DQSFP. The rising pulse DQSRP synchronized with a rising edge of the data strobe signal and the falling pulse DQSFP is in synchronization with a falling edge of the data strobe signal.

Further, the rising pulse output unit 132 includes an even number of inverters and the falling pulse output unit 134 includes an odd number of inverters.

Referring to FIG. 5, the buffer control unit 200 receives the internal write command signal IWT, the internal clock signal ICLK, the burst length signal BL4, and the driver signal DQSIR and outputs the buffer control signal DISDSP, which controls the data strobe buffer unit 100. The buffer control signal DISDSP confirms the burst length signal BL4 and disables the data strobe buffer unit 100 at the time point when the write is finished. Therefore, the signal is blocked from the time point at which the ringing is generated and thus the generation of the pulse due to the ringing is prevented.

Figure 7:
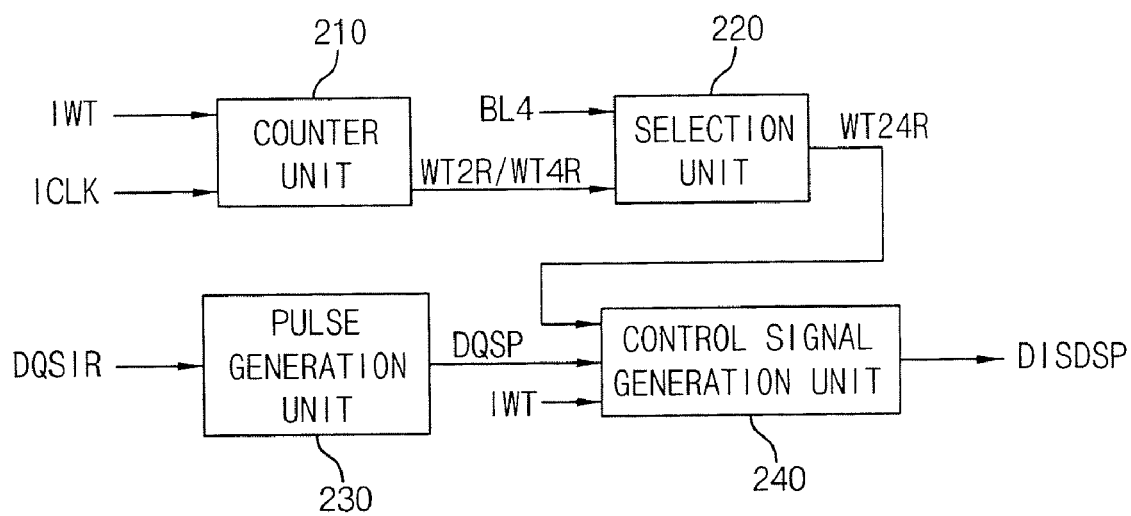
FIG. 7 is a detailed block diagram showing an example of a buffer control unit 200 in FIG. 5.

Hereafter, the configuration of the buffer control unit 200 will be described in detail with reference to FIG. 7. The buffer control unit 200 includes a counter unit 210 which receives, the internal write command signal IWT and the internal clock signal, a selection unit 220 that selects one of the output signals WT2R and WT4R of the counter unit according to the burst length signal and outputs a burst end signal WT24R notifying the time point at which the write is finished, a pulse generation unit 230 which receives, the driver signal DQSIR and generates and outputs the pulse signal DQSP, and a control signal generation unit 240 which combines the pulse signal DQSP and the burst end signal WT24R to generate the buffer control signal DISDSP.

Figure 8:
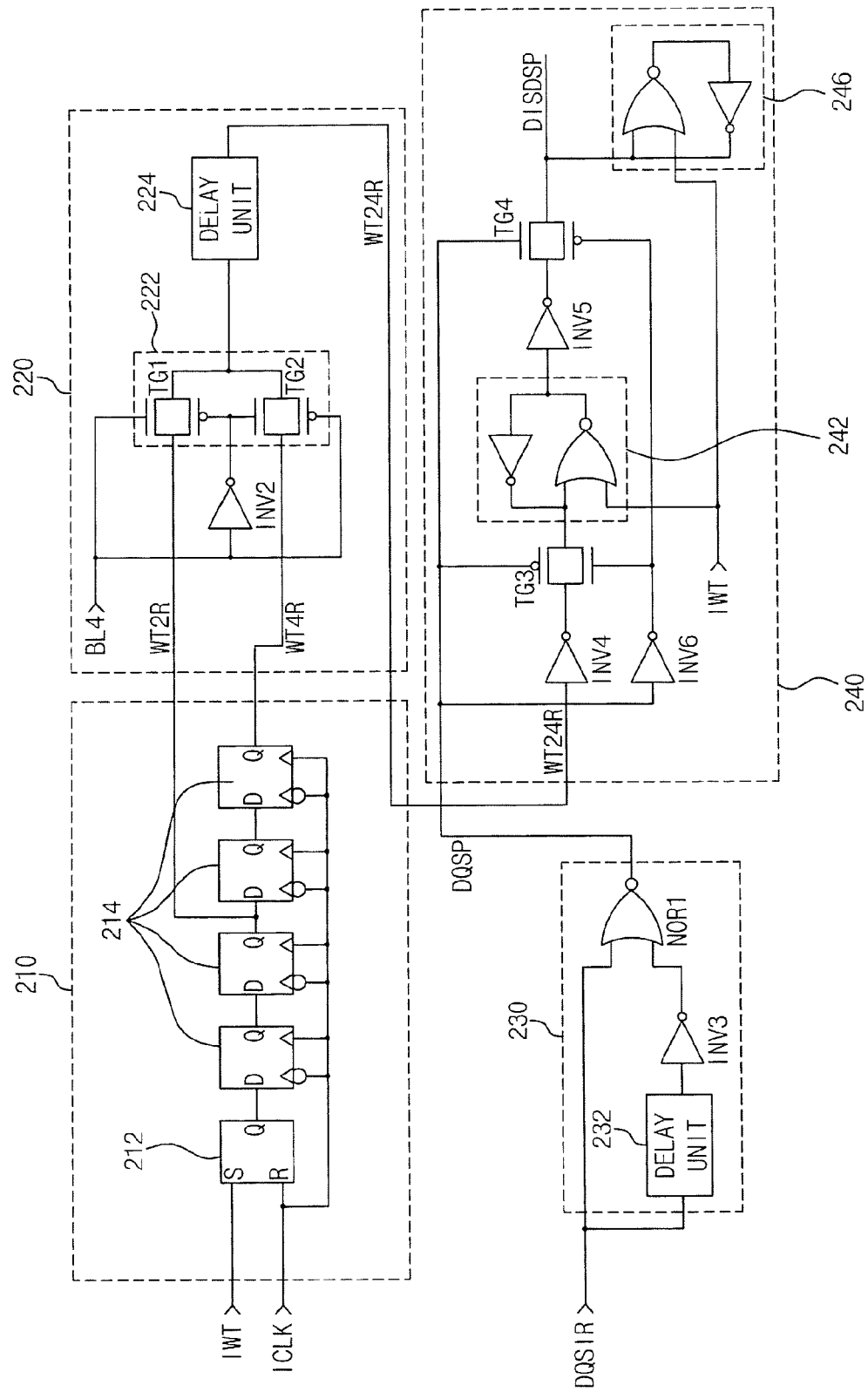
FIG. 8 is a detailed circuit diagram of FIG. 7.

FIG. 8 shows a detailed circuit diagram of the buffer control unit 200.

Referring to FIG. 8, the counter unit 210 includes a RS latch 212 which receives the internal write command signal IWT and the internal clock signal ICLK, and a plurality of D latches 214 that latch output of the latch 212. The RS latch 212 generates a pulse having a size of a single clock period (1*tCK). The pulse is set at the internal write command signal IWT and reset at the internal clock signal ICLK. The D latches 214 transfer the output of the RS latch 212 at every rising edge of the internal clock signal ICLK. The number of latches shown in FIG. 8 is only an example of the number of latches that may be formed; the number of the D latches may be adjusted as necessary according to the present invention. In the present embodiment, four D latches are used and the second D latch outputs a single counter signal WT2R and the fourth D latch outputs a single counter signal WT4R. In other words, the counter signal WT2R counts two clock cycles and the counter signal WT4R counts two clock cycles.

The selection unit 220 selects any one of the counter signals WT2R and WT4R and outputs it as the burst end signal WT24R. Since each counter signal counts two clock cycles, four clock cycles are needed when the burst length is eight, therefore the selection unit selects the counter signal WT4R and outputs it after delay of a predetermined time. The selection unit 220 includes a transfer unit 222 which is controlled by the burst length signal BL4 and a delay unit 224 which delays the output signal of the transfer unit 222 by a predetermined time and outputs the burst end signal WT24R.

The delay unit 224 delays the signal output signal by the transfer unit 222 such that the rising edge of the burst end signal WT24R is generated prior to the last rising edge of the pulse signal DQSP (described below in detail) i.e., the last pulse of the pulse signal DQSP synchronized with an effective pulse. For example, when the burst length is eight, a transfer gate TG2 of the selection unit 222 is opened because the burst length signal BL4 becomes a logic 'low' level and the counter signal WT4R is transferred to the delay unit 224 and outputted as the burst end signal WT24R. The time point at which the rising edge of the burst end signal WT24R is generated should precede the last rising edge of the pulse signal DQSP in the case of tDQSSmin, and as such it is preferable that the delay amount of the delay unit 224 is less than that of the related art.

The pulse generation unit 230 receives and delays the driver signal DQSIR and combines the driver signal DQSIR and the delayed driver signal and to generate the pulse signal DQSP. The pulse generation unit 230 includes a delay unit 232 that delays the driver signal DQSIR by a predetermined time, an inverter INV3 that inverts the output of the delay unit 232, and a NOR gate NOR1 performing a NOR-logical operation on the output signal of the inverter INV3 and the driver signal DQSIR.

The control signal generation unit 240 combines the burst end signal WT24R and the pulse signal DQSP to generate the buffer control signal DISDSP.

The control signal generation unit 240 includes transfer gates TG3 and TG4 controlled by the pulse signal DQSP and an inverter INV6 inverting the pulse signal DQSP, the transfer gates TG3 and TG4 transfer the burst end signal WT24R. The control signal generation unit 240 also includes an inverter INV4 inverting the phase of the WT24R signal, a latch unit 242 that latches the signal inverted by the inverter INV4, and an inverter INV5 that inverts the output of the latch unit 242.

The control signal generation unit 240 further includes a latch unit 246 that receives and latches the internal write command signal IWT and outputs the latched signal as the buffer control signal DISDSP. The internal write command signal IWT becomes logic 'high' according to the beginning of new write operation, and as such the driver signal DQSIR should be outputted continuously.

The transfer gate TG3 transfers data when the pulse signal DQSP has logic 'low' level, and the transfer gate TG4 transfers data when the pulse signal DQSP has a logic 'high' level.

Figure 9:
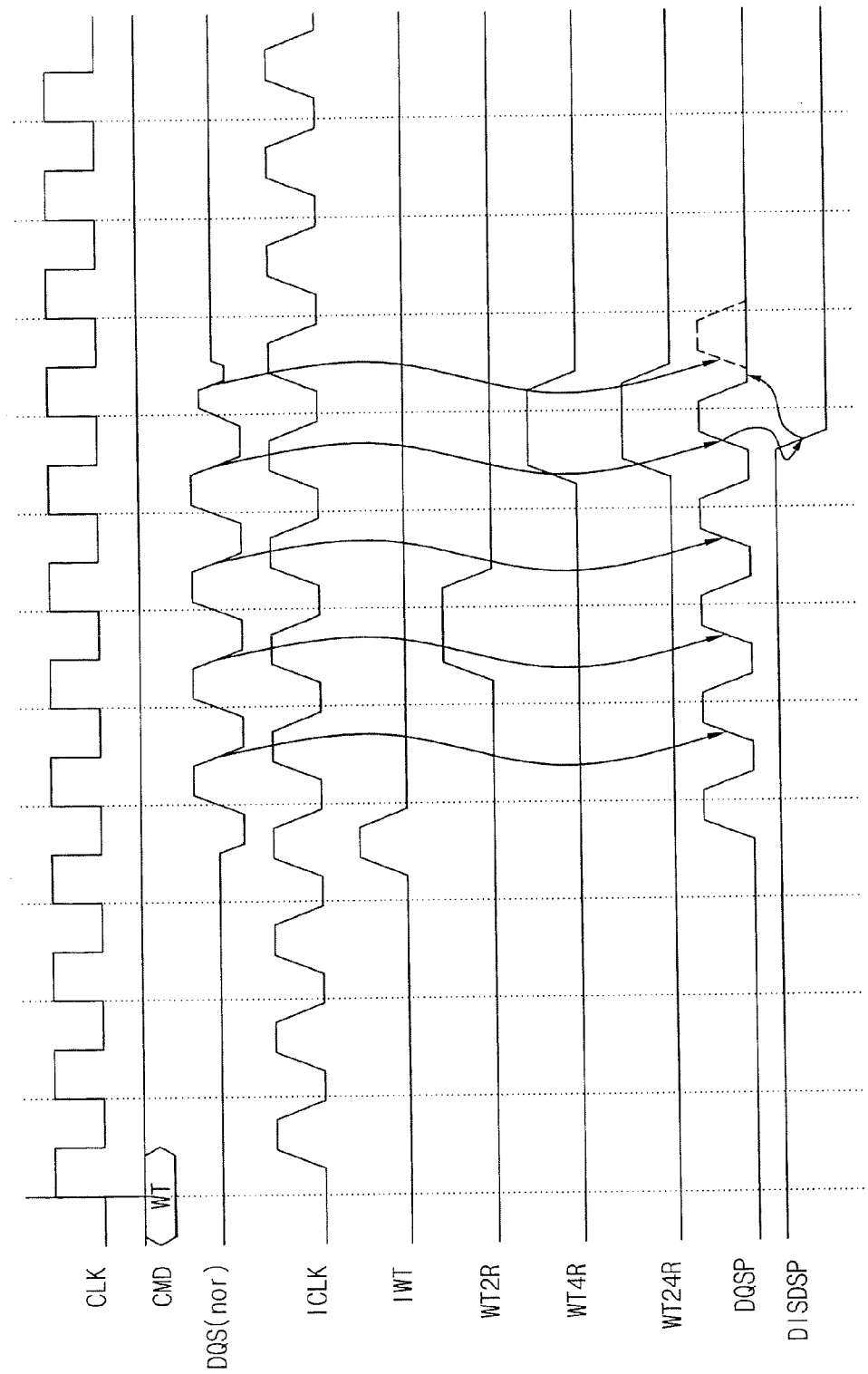
FIG. 9 is a waveform diagram illustrating an operation of FIG. 8 in a normal mode.
Figure 10:
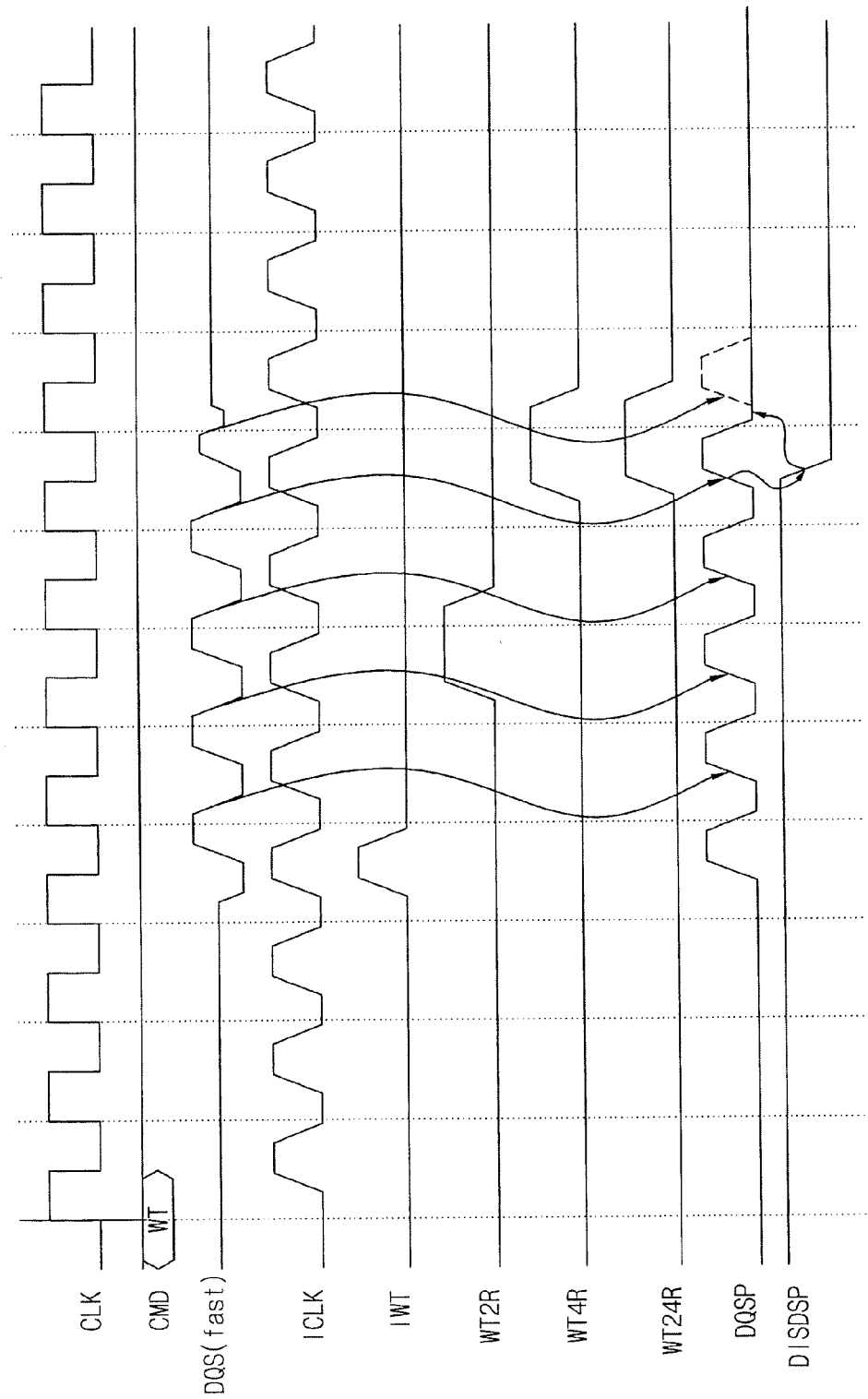
FIG. 10 is a waveform diagram illustrating an operation of FIG. 8 in a fast mode.
Figure 11:
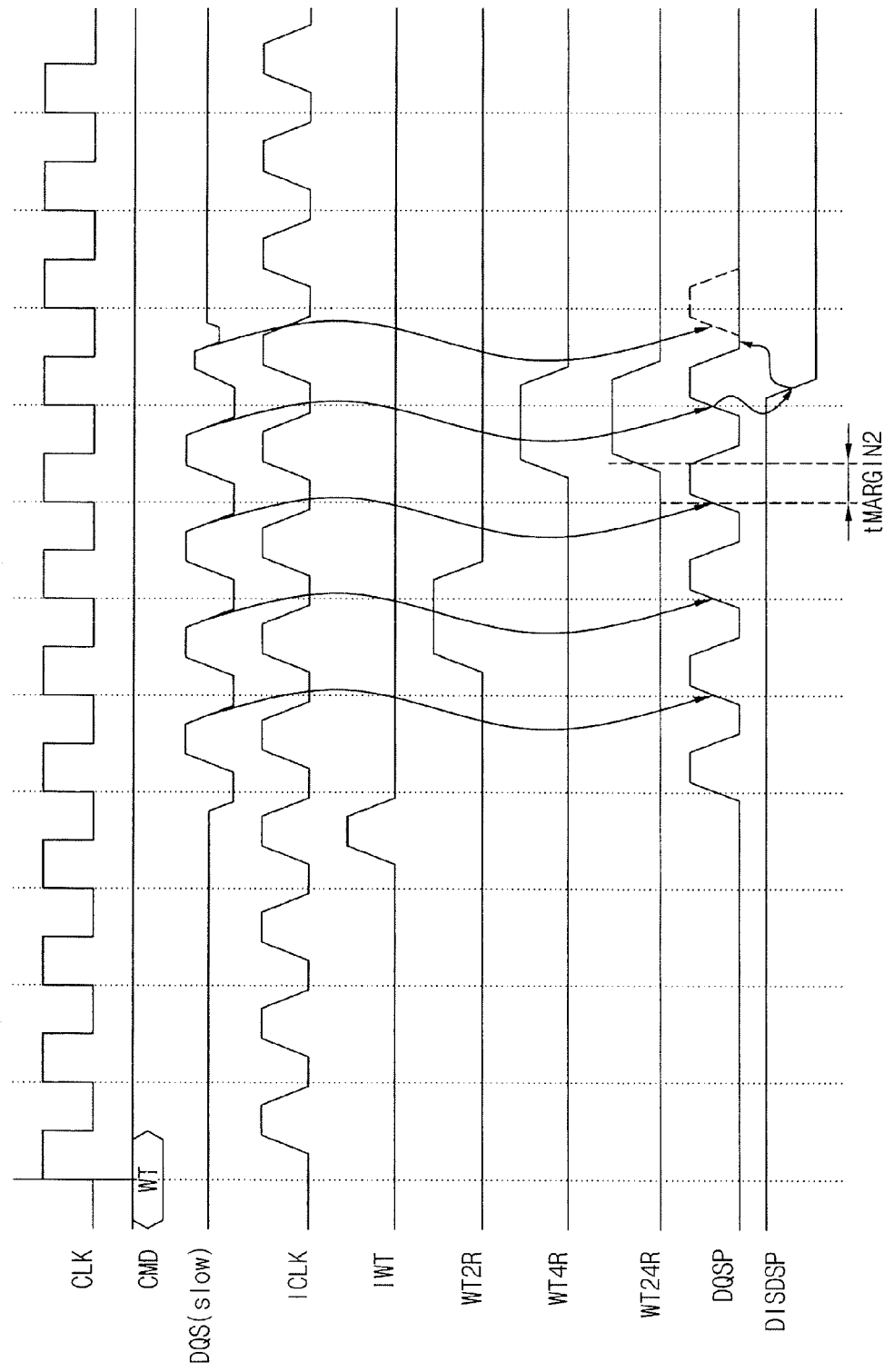
FIG. 11 is a waveform diagram illustrating an operation of FIG. 8 in a slow mode.

FIGS. 9 through 11 are operation timing diagrams of the device, and FIG. 9 illustrates a case having the data strobe signal normally inputted, FIG. 10 illustrates a case (tDQSSmin) having the data strobe signal inputted earlier than in the normal case, and FIG. 11 illustrates a case (tDQSSmax) having the data strobe signal inputted later than in the normal case.

Referring to FIG. 9, the rising edge of the burst end signal WT24R precedes a rising edge of a pulse, which is synchronized with the fourth falling edge of the data strobe signal DQS(nor), among the pulses of the pulse signal DQSP.

The inverter INV4, the latch unit 242, and the inverter INV5 set the burst end signal WT24R to the logic 'low' level and when the pulse signal DQSP becomes a logic 'high' level the burst end signal WT24R is outputted as the buffer control signal DISDSP at a 'low' level through the transfer gate TG4.

Referring to FIG. 10, the rising edge of the burst end signal WT24R precedes the rising edge of the pulse, which is synchronized with fourth falling edge of the data strobe signal DQS(fast), among the pulses of the pulse signal DQSP even if the data strobe signal DQS is inputted earlier in the fast mode. Therefore, likewise the normal mode, it is possible to prevent the generation of a pulse due to the ringing on the driver signal DQSIR.

Referring to FIG. 11, the burst end signal WT24R is enabled to the 'high' level during a pulse synchronized with a falling edge of third pulse of the data strobe signal DQS maintains a 'high' level. It can be appreciated that the pulse signal DQSP is already in 'high' before the burst end signal WT24R becomes 'high' level as the data strobe signal DQS (slow) is inputted later in the slow mode. In related art, there is a problem that the buffer control signal DISDSP is enabled to the 'low' level as soon as the burst end signal becomes the 'high', when the pulse signal DQS is already in the 'high' level at this time, even the effective pulse is blocked.

Figure 1:
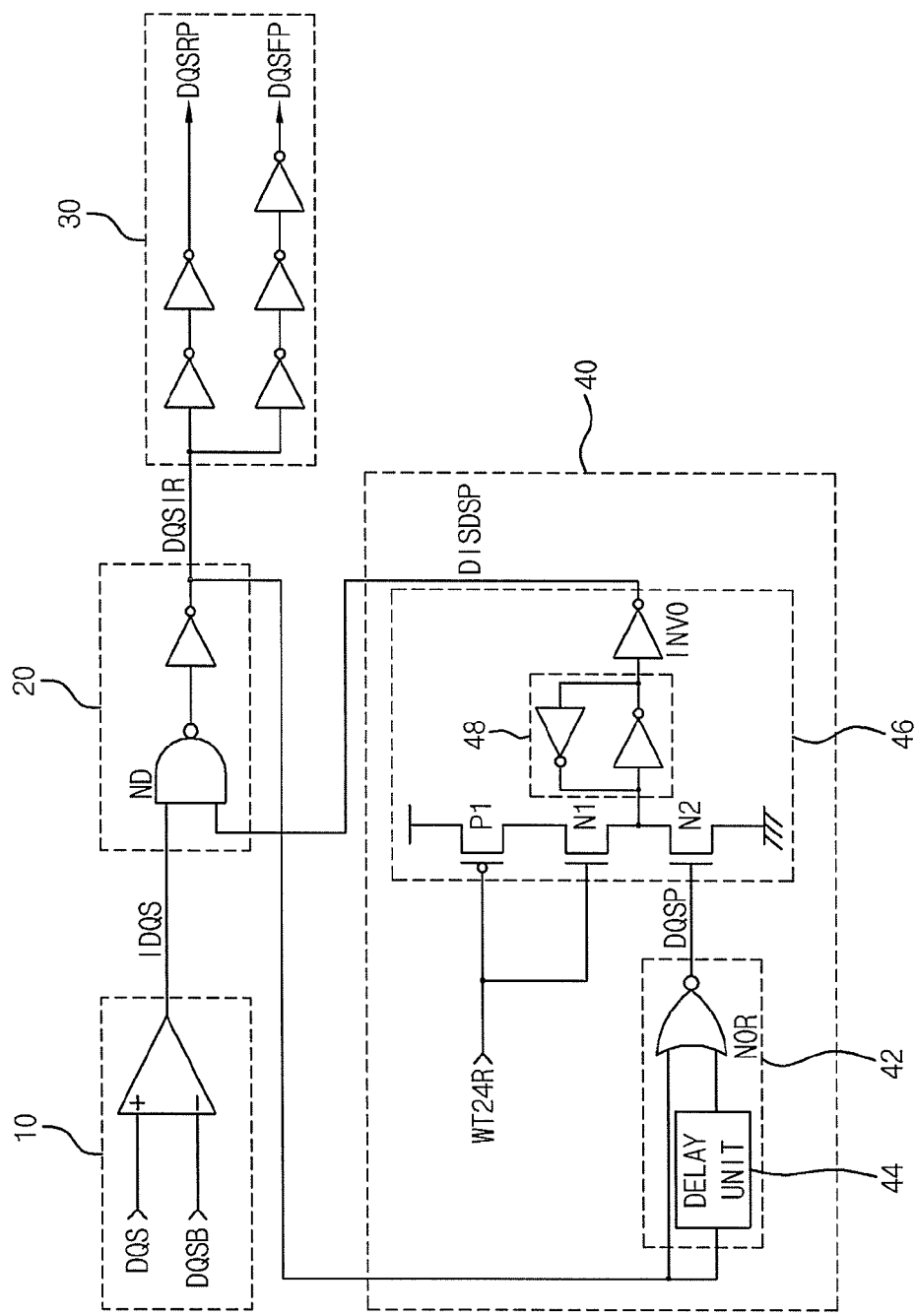
FIG. 1 is a circuit diagram showing a ringing masking device according to a related art.
Figure 2:
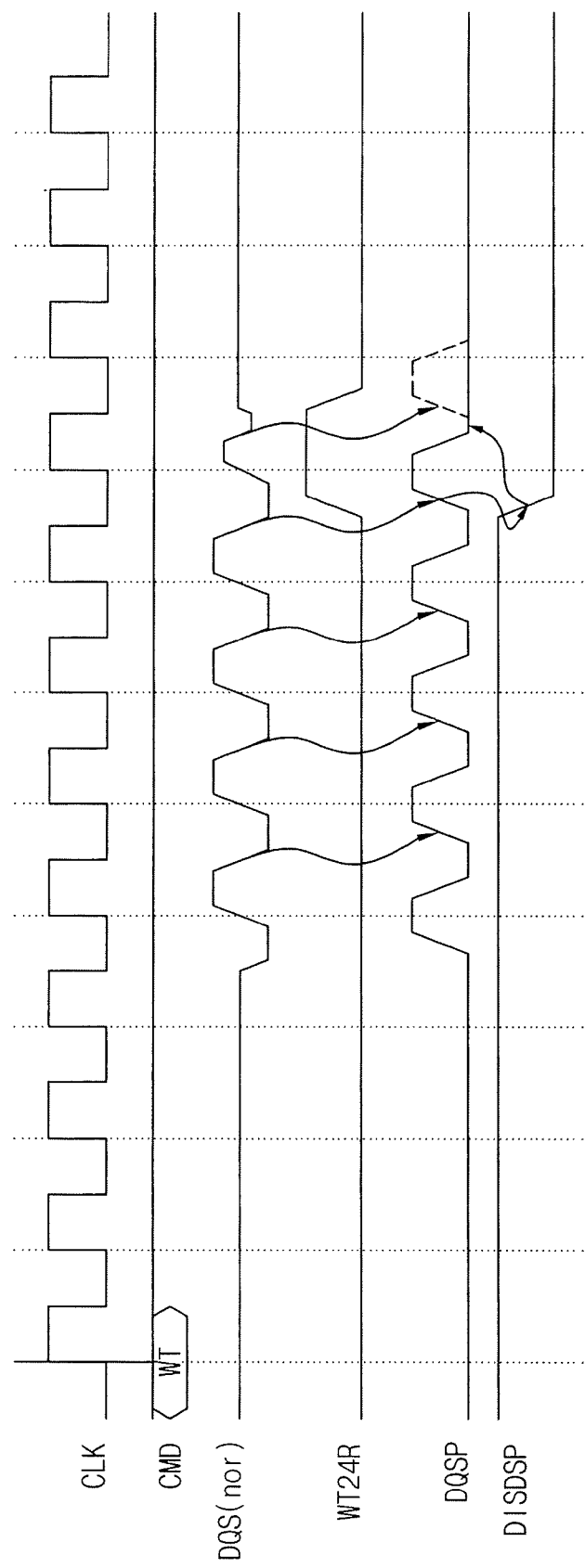
FIG. 2 is a waveform diagram illustrating an operation of FIG. 1 in a normal mode.
Figure 3:
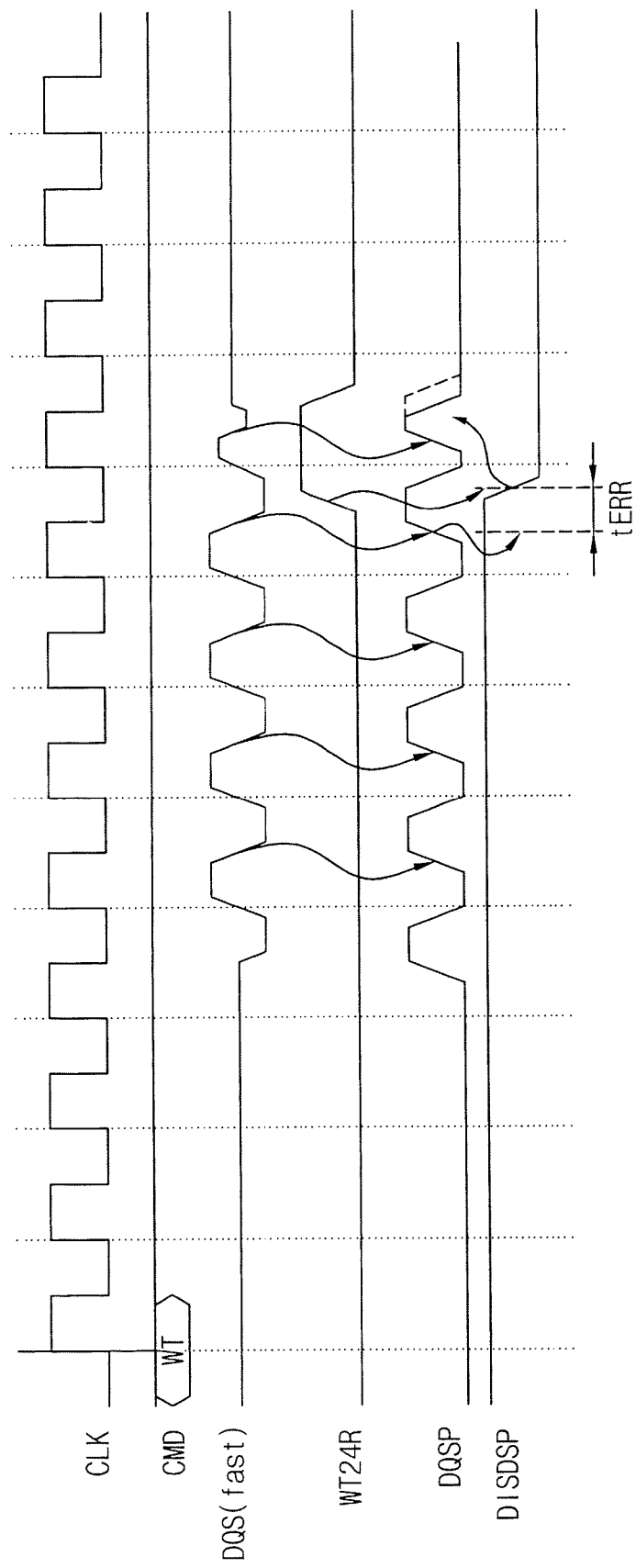
FIG. 3 is a waveform diagram illustrating an operation of FIG. 1 in a fast mode.
Figure 4:
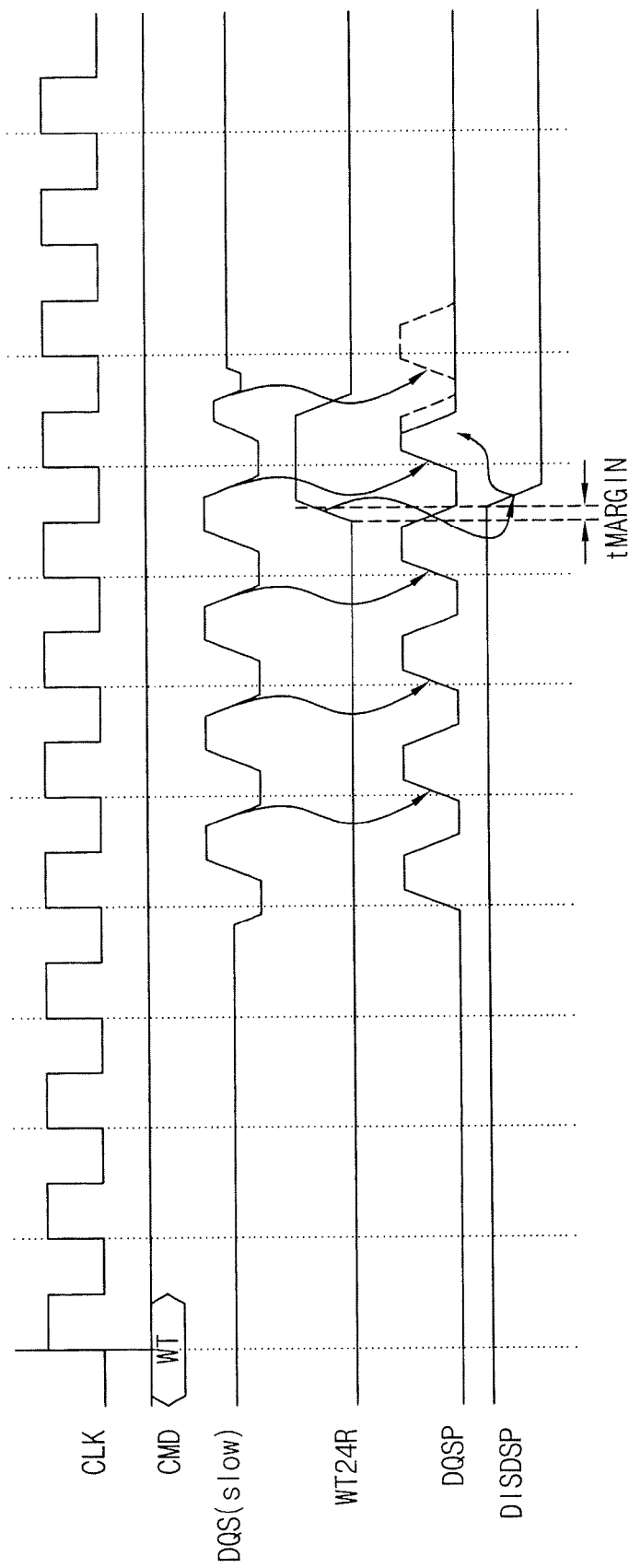
FIG. 4 is a waveform diagram illustrating an operation of FIG. 1 in a slow mode.

However, according to the present invention, even if the burst end signal WT24R is transited to the 'high' level during the pulse synchronized with the falling edge of the third pulse of the data strobe, signal DQS maintains a 'high' level, the burst end signal WT24R is latched in the latch unit 242 and maintains the latched state. Therefore, the buffer control signal DISDSP is not instantly enabled when the burst end signal WT24R becomes the 'high' level, and the buffer control signal DISDSP is enabled to the 'low' level only at the next rising edge of the pulse signal DQSP. In the related art, the margin tMARGIN is needed between the falling edge of the pulse signal DQSP and the rising edge of the burst end signal as shown in FIG. 4. However, in the present invention, it is possible to improve the tDQSS property in the tDQSSmax condition since the margin tMARGIN2 present between the falling edge of the pulse signal DQSP and the rising edge of the burst end signal WT24R alone is sufficient, as shown in FIG. 11. Also, in the tDQSSmin condition, it is possible to block the ringing signal since the buffer signal DISDSP is outputted at the normal time point without delay.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A ringing masking device, comprising:
 a data strobe buffer unit configured to generate a buffer signal by buffering a data strobe signal and outputting a rising pulse synchronized with a rising pulse of the buffer signal and a falling pulse synchronized with a falling pulse of the buffer signal; and
 a buffer control unit configured to generate a buffer control signal by latching a burst end signal and outputting the buffer control signal according to a control of a pulse signal generated in response to the buffer signal and the buffer control signal.

2. The ringing masking device as set forth in claim 1, wherein the buffer control unit comprises:
 a pulse generation unit receiving a driving signal generated in response to the buffer signal and the buffer control signal, and generating the pulse signal;
 a burst end signal generation unit receiving an internal write command signal and an internal clock signal and generating the burst end signal that indicates an end of a write operation; and
 a control signal generation unit latching the burst end signal to generate the buffer control signal and outputting the buffer control signal according to the pulse signal.

3. The ringing masking device as set forth in claim 2, wherein a rising edge of the burst end signal is generated prior to a rising edge of a pulse of the pulse signal, wherein the pulse of the pulse signal is synchronized with the last edge of the data strobe signal.

4. The ringing masking device as set forth in claim 2, wherein the burst end signal generation unit comprises:
 a counter unit receiving the internal write command signal and the internal clock signal, counting the number of clock cycles generated after the input of the internal write command signal, and outputting a plurality of counter signals; and a selection unit receiving the plurality of counter signals and selectively outputting a counter signal of the plurality of counter signals according to a burst length signal.

5. The ringing masking device as set forth in claim 4, wherein the counter unit comprises:
   an RS latch generating a pulse having a size of a single clock period, wherein the pulse having the size of a single clock period is set according to the internal write command signal and reset according to the internal clock signal; and
   a plurality of D latches transferring the output of the RS latch at every rising edge of the internal clock signal.

6. The ringing masking device as set forth in claim 4, wherein the selection unit delays the selected counter signal, wherein the rising edge of the delayed counter signal is generated prior to the last rising edge of an effective pulse of the pulse signal.

7. The ringing masking device as set forth in claim 4, wherein the control signal generation unit comprises:
   a first latch unit inverting the burst end signal; and
   a transfer unit controlling transfer of a signal inputted into the first latch unit and a signal outputted from the first latch unit according to the pulse signal.

8. The ringing masking device as set forth in claim 7, wherein the transfer unit comprises:
   a first transfer unit inverting the burst end signal and transferring the inverted burst end signal to the first latch unit when the pulse signal is in a logic 'low' state; and
   a second transfer unit inverting the burst end signal and transferring the inverted burst end signal to the first latch unit when the pulse signal is in a logic 'high' state.

9. The ringing masking device as set forth in claim 7, wherein the first latch unit comprises:
   a NOR calculation unit receiving the burst end signal and the internal write command signal; and
   an inverter inverting the output of the NOR calculation unit and providing the inverted output to the NOR calculation unit.

10. The ringing masking device as set forth in claim 7, wherein the control signal generation unit further comprises a second latch unit receiving the internal write command signal and disabling the buffer control signal to logic 'high' when the internal write command signal is enabled.

11. A ringing masking device, comprising:
   a data strobe buffer unit buffering a data strobe signal and outputting a buffer signal;
   a driver unit outputting a driver signal in response to the buffer signal and a ringing control signal;
   a pulse output unit receiving the driver signal and outputting a rising pulse and a falling pulse; and
   a ringing control signal generation unit receiving a burst end signal indicating a time point at which a write is finished and latching the burst end signal, controlling transfer of input and output of the burst end signal according to a pulse signal generated in response to the driver signal and outputting the ringing control signal enabled to low level to disable the driver at the time point at which both the burst end signal and the pulse signal become high level.

12. The ringing masking device as set forth in claim 11, wherein the ringing control signal generation unit enables the ringing control signal at a time point after the burst end signal is transited to high level when the pulse signal is transited to high level and a rising edge of the pulse signal is generated.

13. The ringing masking device as set forth in claim 11, wherein the ringing control signal generation unit latches the burst end signal at a rising edge of the pulse signal and enables the ringing control signal at the next rising edge of the pulse signal when the burst end signal is transited to high level after the pulse signal is transited to high level.

14. The ringing masking device as set forth in claim 11, wherein the ringing control signal generation unit comprises
   a first latch unit latching the burst end signal;
   a first transfer unit transferring the burst end signal to the latch unit when the pulse signal is in low level; and
   a second transfer unit transferring the output signal of the first latch unit when the pulse signal is in high level.

15. The ringing masking device as set forth in claim 11, wherein the ringing control signal generation unit comprises a second latch unit disabling the ringing control signal when the internal write command signal is enabled.

* * * * *